(12) United States Patent
Wang et al.

(10) Patent No.: US 6,878,242 B2
(45) Date of Patent: Apr. 12, 2005

(54) SEGMENTED SPUTTERING TARGET AND METHOD/APPARATUS FOR USING SAME

(75) Inventors: Hong Wang, Belleville, MI (US); Thomas A Seder, Northville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 16 days.

(21) Appl. No.: 10/408,790

(22) Filed: Apr. 8, 2003

(65) Prior Publication Data

US 2004/0206620 A1 Oct. 21, 2004

(51) Int. Cl.$^7$ ............................................. C23C 14/34
(52) U.S. Cl. ........................... 204/192.22; 204/192.12; 204/192.15; 204/298.13; 204/298.28
(58) Field of Search ...................... 204/298.12, 298.13, 204/298.28, 192.12, 192.15, 192.22

(56) References Cited

U.S. PATENT DOCUMENTS

| | | | |
|---|---|---|---|
| 4,026,787 A | 5/1977 | Kuehnle ..................... 204/298 |
| 4,468,313 A | * 8/1984 | Okumura et al. ...... 204/298.12 |
| 4,488,956 A | 12/1984 | Scherer et al. .............. 204/298 |
| 5,073,245 A | 12/1991 | Hedgcoth .............. 204/298.21 |
| 5,096,562 A | 3/1992 | Boozenny et al. ..... 204/298.22 |
| 5,213,672 A | 5/1993 | Hartig et al. .......... 204/298.22 |
| 5,262,032 A | 11/1993 | Hartig et al. .......... 204/298.21 |
| 5,284,564 A | 2/1994 | Maass ..................... 204/298.2 |
| 5,317,006 A | 5/1994 | Kumar .................. 204/298.12 |
| 5,366,607 A | 11/1994 | Lal et al. ............... 204/298.19 |
| 5,403,458 A | 4/1995 | Hartig et al. .......... 204/192.15 |
| 5,427,665 A | 6/1995 | Hartig et al. .......... 204/192.12 |
| 5,466,355 A | * 11/1995 | Ohhashi et al. ........ 204/298.13 |
| 5,527,439 A | 6/1996 | Sieck et al. ............ 204/192.22 |
| 5,591,314 A | 1/1997 | Morgan et al. ........ 204/298.22 |
| 5,871,622 A | * 2/1999 | Pinarbasi ............... 204/192.11 |
| 6,375,815 B1 | 4/2002 | Lynn et al. ............ 204/298.22 |
| 6,488,822 B1 | 12/2002 | Moslehi ................. 204/192.12 |
| 2001/0047936 A1 | * 12/2001 | McLeod ................ 204/298.12 |

FOREIGN PATENT DOCUMENTS

WO    WO 02/27057    4/2002    ........... C23C/14/00

* cited by examiner

*Primary Examiner*—Steven Versteeg
(74) *Attorney, Agent, or Firm*—Nixon & Vanderhye P.C.

(57) ABSTRACT

A rotating sputtering target(s) is segmented so as to include a plurality of different sputtering material portions or segments radially dispersed around the outer periphery of the target. This enables a plurality of different layers to be sputter-deposited, one after the other, using the same sputtering target as the target rotates. The thicknesses of the different layers can be controlled by the radially extensive size of the different segments, the rotation speed of the target, the material sputter rate, the sputtering power used, and/or the line speed of the sputter coater in which the target(s) is located. One or more such targets may be used in a coater according to different embodiments of this invention.

19 Claims, 3 Drawing Sheets

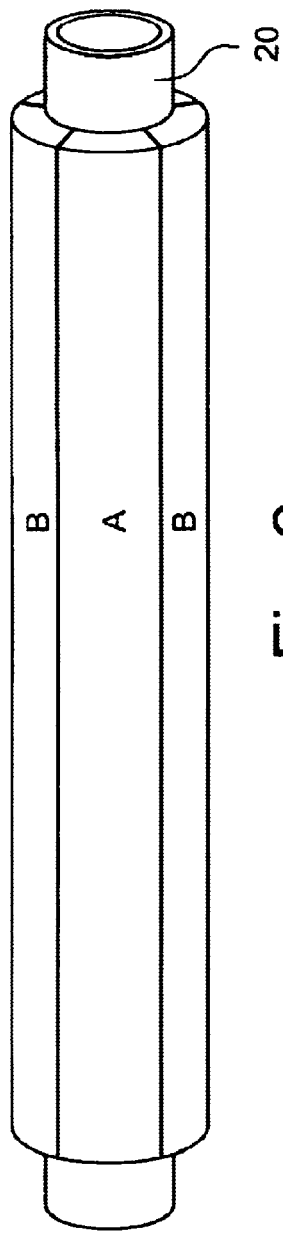
Fig. 2
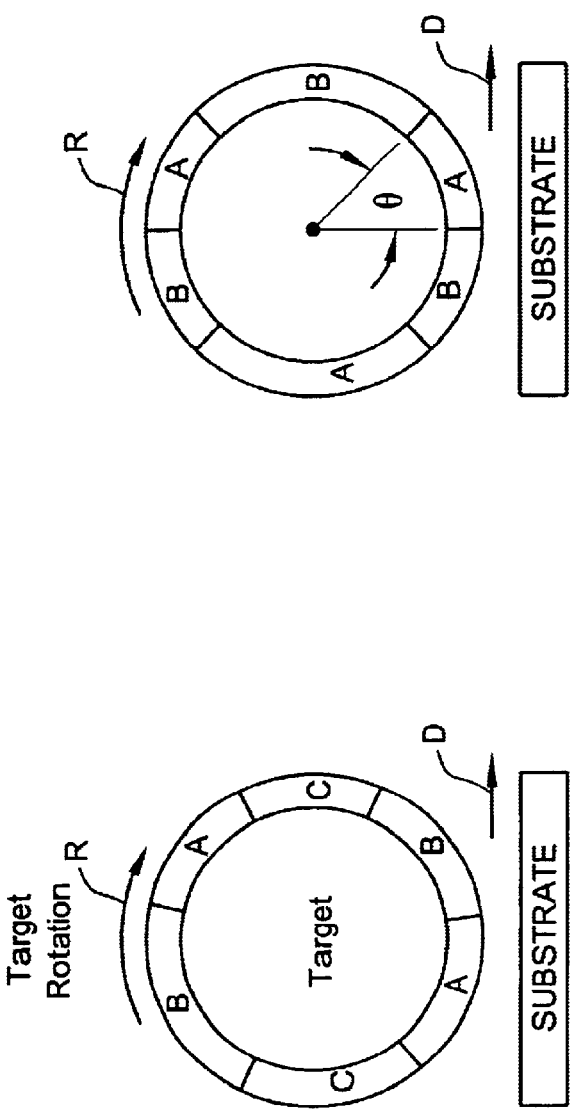
Fig. 4
Fig. 3

SEGMENTED SPUTTERING TARGET AND METHOD/APPARATUS FOR USING SAME

This invention relates to a sputtering target including multiple segments, and/or to a method of sputtering a coating onto a substrate using such a target(s).

BACKGROUND OF THE INVENTION

The use of sputtering in order to depositing coatings on substrates is known in the art. For example, and without limitation, see U.S. Pat. Nos. 5,403,458; 5,317,006; 5,527,439; 5,591,314; 5,262,032; and 5,284,564, the disclosures of which are hereby incorporated herein by reference.

Sputter coating is typically known as an electric discharge type process which is conducted in a vacuum chamber in the presence of at least one gas. Typically, a sputtering apparatus includes a vacuum chamber(s), a power source, an anode, and one or more cathode targets which include a material used to create a layer in the coating system. When an electrical potential is applied to the cathode target, the gas forms a plasma which bombards the target causing particles of the material from the target to leave the target itself. This material, which has left the target, typically falls onto the substrate in order to help form the coating. When sputtering is conducted in the presence of a reactive gas, a reactive product of the target material and the gas forms on the substrate in order to help form the coating. Different types of sputtering targets may be used (e.g., planar targets, rotational cylindrical targets, etc.). Magnetron type sputtering is one such example of a sputtering which is commonly used in the art. In certain instances, rotatable sputtering targets may be used in C-MAG type magnetron sputtering systems.

FIG. 1 illustrates a conventional magnetron sputtering apparatus. The apparatus includes metallic walls 1 of the vacuum chamber in which sputtering is performed; and a cylindrical rotating target 3 that is supported by supports 5 so that the target is rotatable about axis 7. Gas is supplied into the sputtering chamber via gas supply 8, and the chamber is evacuated to a pressure less than atmospheric via vacuum pump(s) 10. Substrate (e.g., glass substrate) 9 is moved beneath the target 3 (via rollers or the like) as the target rotates. A plasma is created within the vacuum chamber by applying a voltage from power supply 12 to the sputtering target 3 which is negative relative to the walls 1 or the like which may be grounded. The plasma is positioned adjacent a sputtering zone of the target, such position being controlled by magnet(s) which is/are located in the target or at any other suitable location. As material is sputtered from the target 3, it falls onto substrate 9 there under in order to form the coating as is known in the art.

The material of a sputtering target to be sputtered onto a substrate is typically homogenous (i.e., only one type of sputtering material is provided per target). However, occasionally targets included multiple sputtering materials have been mentioned.

For example, U.S. Pat. No. 5,427,665 to Hartig et al. discloses a sputtering target including alternating strips on different sputtering materials around the target. These different materials each extend all the way around the periphery of the target, but are axially segmented from one another along the length of the target. The first material (e.g., Si) located in the center of the target has a high affinity for reactive gas, while the second material (e.g., Sn) located only at the axial ends of the cylindrical target have a low affinity for the reactive gas. However, the purpose of this target is not to deposit different materials on a substrate. In fact, given a single gas in the sputtering device, this target would be incapable of depositing an alternating layer stack on a substrate. Instead, the purpose of the different materials of the target in the '665 Patent is to cause the first material (Si) to be sputtered onto the substrate while the second material (Sn) is sputtered onto a diaphragm shield so that it does not reach the substrate (e.g., see the '665 Patent at col. 2, lines 17–23; and col. 5, lines 40–44).

U.S. Pat. No. 5,403,458, also to Hartig et al., is similar to the aforesaid '665 Patent in that it briefly mentions that strips of different materials may be provided (see col. 10, lines 18–21). However, these different strips of the '458 Patent are not for depositing alternating layers on a substrate. Instead, these different materials of the '458 Patent are a) target material, and b) dopant, respectively. Moreover, Hartig '458 does not disclose how the dopant strips are oriented on the target.

Repetitive multi-layer/superlattice coating structures have been reported in the art to exhibit desirable properties. For example, metallic superlattices may be used in x-ray optics and semiconductor devices. Ceramic nanoscale multi-layer structures such as TiN/VN, TiN/WN, TiN/AlN, TiN/NbN, TiAlN/CrN, etc. are characterized by desirable hardness, wear resistance, oxidation resistance and/or corrosion resistance. In addition, many optical band filters such as Rugate filters use repeated high/low index layers (e.g., titanium oxide (e.g., $TiO_2$)/silicon dioxide) in the layer stack.

Conventionally, the aforesaid superlattice structures and/or alternating high/low index layer stacks have been sputter deposited where a single cathode target is used for each layer. Thus, the number of layers to be deposited dictates the number of sputter targets required. For example, if a repeating high/low index layer stack requires 30 layers (15 of the high index of refraction material, and 15 of the low index of refraction material), then at least 30 sputtering targets are required (at least 15 targets of the high index material, and at least 15 targets of the low index material). The high/low index targets are arranged in alternating fashion along the sputtering line. The use of such a large number of sputtering targets is not practical given the layer stack to be deposited, as it requires a very long sputter coater with many chambers/targets.

Thus, it will be apparent to those skilled in the art that there exists a need for a more efficient way in which to sputter deposit layers stacks that use repeated alternating high/low index layers, and/or multi-layer/superlattice coating structures.

BRIEF SUMMARY OF EXAMPLE EMBODIMENTS OF THE INVENTION

In certain example embodiments of this invention, a rotating sputtering target(s) (e.g., for use in C-MAG sputtering systems) is provided which is segmented so as to include a plurality of different sputtering material portions or segments radially dispersed around the outer periphery of the target to be sputtered. This enables a plurality of different layers to be sputter-deposited, one after the other, using the same sputtering target as the target rotates. The thicknesses of the different layers can be controlled by the radially extensive size of the different segments, the rotation speed of the target, the material sputter rate, sputtering power, and/or the line speed of the sputter coater in which the target(s) is located. One or more such targets may be used in a coater according to different embodiments of this invention.

In certain example embodiments, the radially dispersed segments around the periphery of the target comprise alternating segments of first and second materials, where the different segments contact one another at interfaces thereof. In other example, embodiments, the segments may comprise segments of three or more different materials.

Targets according to different example embodiments of this invention may include the segments formed over a common backing or base material.

In certain example embodiments of this invention, there is provided a rotating sputtering target for depositing layers of different material, the rotating sputtering target comprising: a continuous outer periphery to be sputtered, the continuous outer periphery being circular in shape when viewed cross sectionally, the continuous outer periphery of the rotating sputtering target comprising, around its circumference, a plurality of immediately adjacent segments of different materials to be sputtered for forming respective different layers on a substrate, and wherein the segments of different materials are located at different radial locations around the circumference of the rotating sputtering target.

In other example embodiments of this invention, there is provided a method of sputtering at least part of a coating on a substrate, the method comprising: providing a rotatable sputtering target with an outer periphery comprising, around its circumference, a plurality of different segments of respective different materials to be sputtered for forming respective different layers on the substrate, and rotating the target and sputtering the outer periphery thereof so as to form at least first and second different layers on the substrate, wherein the first layer comprises a material from a first one of the segments and the second layer comprises a material from a second of the segments.

BRIEF DESCRIPTION OF THE DRAWINGS

FIG. 2 is a perspective view of a rotating cylindrical segmented target according to an example embodiment of this invention; this target is representative of both the FIG. 3 embodiment and the FIG. 4 embodiment.

FIG. 3 is a cross sectional view of a segmented target according to an example embodiment of this invention.

FIG. 4 is a cross sectional view of a segmented target according to another example embodiment of this invention.

DETAILED DESCRIPTION OF EXAMPLE EMBODIMENTS OF THE INVENTION

Figure 1:
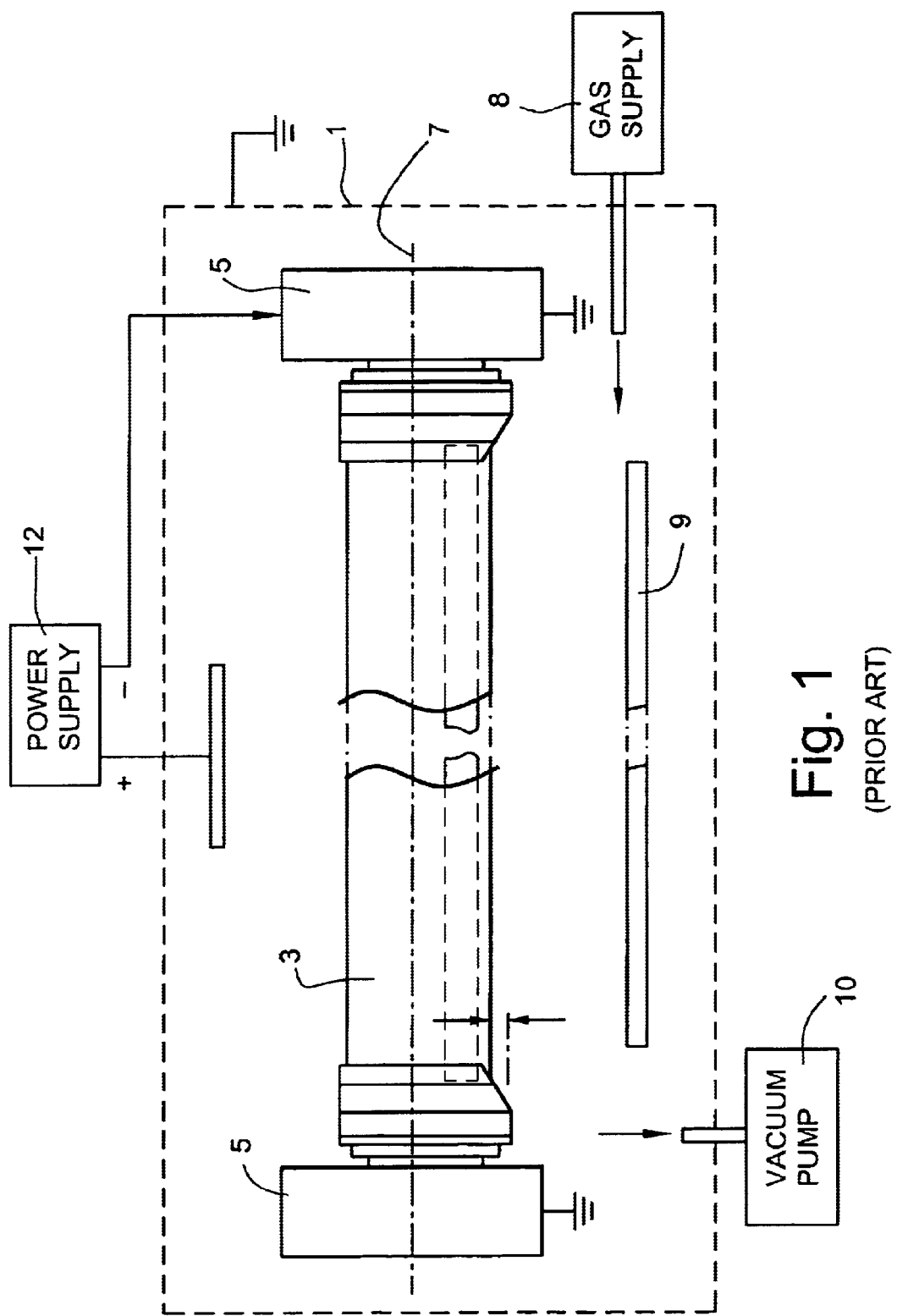
FIG. 1 is a perspective view of a conventional sputter coating apparatus.

Referring now more particularly to the accompanying drawings in which like reference numerals indicate like parts throughout the several views.

According to certain example embodiments of this invention, a rotating sputtering target(s) is provided which is segmented so as to include a plurality of different sputtering material portions or segments radially dispersed around the outer periphery of the target to be sputtered. This enables a plurality of different layers to be sputter-deposited, one after the other, using the same sputtering target as the target rotates. The thicknesses of the different layers can be controlled by the radially extensive size of the different segments, the rotation speed of the target, the material sputter rate, sputtering power, and/or the line speed of the sputter coater in which the target(s) is located. One or more such targets may be used in a coater according to different embodiments of this invention. Sputtering targets according to different embodiments of this invention may be used in the magnetron sputtering apparatus of FIG. 1, or in any other suitable type of sputtering apparatus.

In certain example embodiments, the radially dispersed segments around the periphery of the target comprise alternating segments of first and second materials, where the different segments contact one another at interfaces thereof. In other example, embodiments, the segments may comprise segments of three or more different materials.

FIGS. 2 and 4 illustrates a sputtering target according to a first embodiment of this invention. The sputtering target includes a base or backing portion 20 on which a plurality of different segments of different materials A and B are formed. In certain example embodiments of this invention, the material of segments A is a high index of refraction material for forming high index layers and the material of segments B is a low index of refraction material for forming low index layers. In certain example instances, segments B may have an index of refraction at least 10% less than segments A (more preferably at least 20% less, and most preferably at least 25% less). In a similar manner, layers to be formed by segments B may have an index of refraction at least 10% less than layers formed by segments A (more preferably at least 20% less, and most preferably at least 25% less). The target shown in FIGS. 2 and 4 is adapted to rotate in direction R, while the substrate (the substrate may be of or include glass, plastic, semiconductor, or any other suitable material in different embodiments of this invention) passing under the target may be stationary or alternatively may move in direction D.

Figure 5:
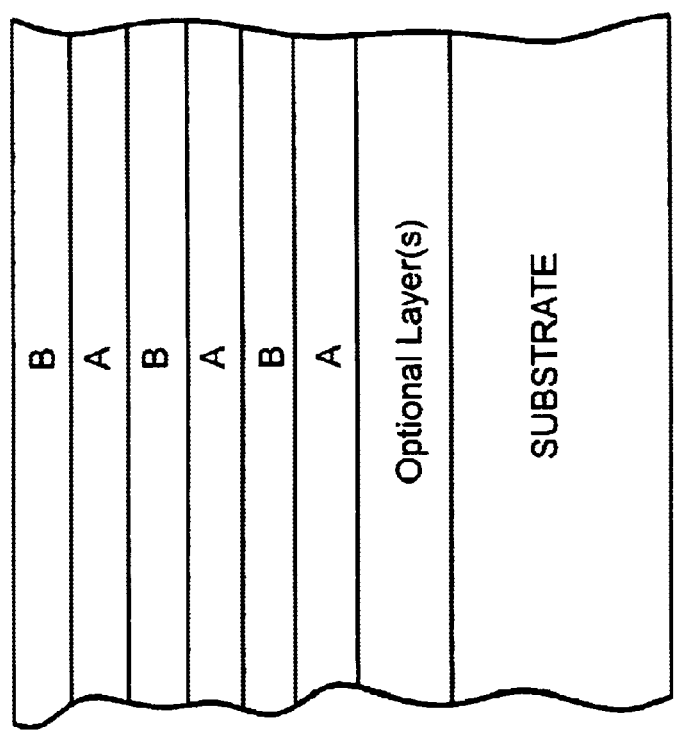
FIG. 5 is a cross section view of at least part of a coating formed using the target of FIG. 4 according to an example embodiment of this invention.

Thus, referring to FIGS. 4–5, as the segmented target rotates in direction R, alternating high/low index layers A/B/A/B/A/B are formed on the substrate as shown in FIG. 5. The respective thicknesses of the layers may be controlled by one or more of the radially extensive size of the different segments (i.e., angle θ), the rotation speed of the target, the material sputter rate, sputtering power, and/or the line speed of the sputter coater in which the target(s) is located. In certain instances, with certain line speeds and target rotation speeds, the target of FIG. 4 may only form one layer A and one layer B on the substrate, with subsequent layers A/B being formed on the substrate with subsequent targets in the coater. Thus, as shown in FIGS. 4–5, targets according to certain example embodiments of this invention are advantageous in that more than one layer can be formed on a substrate using only a single rotating sputtering target.

FIG. 5 illustrates that, optionally, other layers may be provided on the substrate below, between and/or above layers formed using segmented targets according to the instant invention.

Rotating targets herein may be cylindrical or otherwise shaped in different embodiments of this invention, so that the outer peripheral surface of the target is sputtered in order to form the layers on the substrate.

In certain example embodiments of this invention, angle θ, which defines the arcuate extent of each segment at the outer periphery of the target, is from 20 to 180 degrees, more preferably from 30 to 45 degrees for one, two, or all of the segments of a given target. Such angular ranges have been found to be particularly advantageous in certain embodiments of this invention. Moreover, in certain example embodiments of this invention, a target may include from 2 to 20 different segments, more preferably from 2 to 12 different segments radially dispersed around the outer periphery of the target on the target's continuous outer periphery.

As explained above, targets herein may be used to form any suitable layer stack, including but not limited to layers stacks including ceramic nanoscale multi-layer structures such as TiN/VN, TiN/WN, TiN/AlN, TiN/NbN, TiO/SiO, and/or TiAlN/CrN. It is noted that the materials of the different segments may be any suitable material(s) such as metals, ceramics, alloys, or the like in different embodiments of this invention. For example, assume for example that it is desired to form a coating as shown in FIG. 5 where layers A are TiN and layers B are VN. In such an instance, the target of FIG. 4 would be designed so that segments A of the target were of or included Ti and segments B were of or included V. Then, when the target(s) with the Ti segments and the V segments was sputtered in an atmosphere including nitrogen (N) gas (optionally along with Ar gas, and/or any other suitable gas), a coating including a repeating layer stack of TiN/VN would be formed.

FIG. 3 illustrates another example embodiment of this invention. The FIG. 3 embodiment is similar to the embodiment of FIGS. 2, 4 and 5, except that an additional segment of material C is provided on the target. Thus, the target of the FIG. 3 embodiment includes different segments of three different materials A, B and C. As with the aforesaid embodiments, one or more segment of each type (i.e., of each material) may be provided per target in different embodiments of this invention. In certain example instances, the angles θ described above and/or the number of segments described above may also apply to this embodiment.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A rotating sputtering target for depositing layers of different material, the rotating sputtering target comprising:
   a continuous outer periphery to be sputtered, the continuous outer periphery being circular in shape when viewed cross sectionally,
   the continuous outer periphery of the rotating sputtering target comprising, around its circumference, a plurality of immediately adjacent segments of different materials to be sputtered for forming respective different layers on a substrate, and wherein the segments of different materials are located at different radial locations around the circumference of the rotating sputtering target.

2. The sputtering target of claim 1, wherein the different materials comprise first and second materials so that a first group of segments comprises the first material and a second group of segments comprises the second material, the first material for forming a layer having a higher index of refraction than a layer formed by the second material.

3. The sputtering target of claim 2, wherein the second material is for forming a layer(s) having an index of refraction at least 10% less than a layer(s) formed by the first material.

4. The sputtering target of claim 1, wherein the different materials comprise first and second materials so that at least a first segment comprises the first material and at least a second segment comprises the second material, the second material having an index of refraction at least 10% less than the first material.

5. The sputtering target of claim 1, wherein at least one of the segments extends over an arcuate portion of the outer periphery of the target, the arcuate portion being defined by an angle θ of from 20 to 180 degrees.

6. The sputtering target of claim 5, wherein the angle θ is from 30 to 45 degrees.

7. The sputtering target of claim 1, wherein the target comprises from 2 to 16 of the segments.

8. The sputtering target of claim 1, wherein the different materials comprise first and second materials so that a first group of segments comprises the first material and a second group of segments comprises the second material, wherein the first and second materials comprise metals.

9. The sputtering target of claim 8, wherein the first material is selected from the group consisting of: Ti, V, W, Al, Nb, and Cr.

10. The sputtering target of claim 8, wherein each of the first and second materials are selected from the group consisting of: Ti, V, W, Al, Nb and Cr.

11. The sputtering target of claim 1, wherein the target comprises segments of at least three different materials, respectively, around its circumference.

12. A method of sputtering at least part of a coating on a substrate, the method comprising:
    providing a rotatable sputtering target with an outer periphery comprising, around its circumference, a plurality of different segments of respective different materials to be sputtered for forming respective different layers on the substrate, and
    rotating the target and sputtering the outer periphery thereof so as to form at least first and second different layers on the substrate, wherein the first layer comprises a material from a first one of the segments and the second layer comprises a material from a second of the segments.

13. The method of claim 12, wherein the target comprises segments of at least three different materials, respectively, around its circumference.

14. The method of claim 12, wherein the different materials comprise first and second materials so that a first group of segments comprises the first material and a second group of segments comprises the second material, and wherein the first material comprises at least one of: Ti, V, W, Al, Nb, and Cr.

15. The method of claim 14, wherein the second material is different than the first material, but also comprises at least one of Ti, V, W, Al, Nb, and Cr.

16. The method of claim 14, wherein the first material comprises a nitride of at least one of Ti, V, W, Al, Nb and Cr.

17. The method of claim 12, wherein the different materials comprise first and second materials so that at least a first segment comprises the first material and at least a second segment comprises the second material, the second material having an index of refraction at least 10% less than the first material.

18. The method of claim 12, wherein at least one of the segments extends over an arcuate portion of the outer periphery of the target, the arcuate portion being defined by an angle θ of from 20 to 180 degrees.

19. The method of claim 18, wherein the angle θ is from 30 to 45 degrees.

* * * * *